(12) United States Patent
Mieda et al.

(10) Patent No.: US 11,139,449 B2
(45) Date of Patent: Oct. 5, 2021

(54) RESIN COMPOSITION FOR SEALING ORGANIC ELECTRONIC DEVICE ELEMENT, RESIN SHEET FOR SEALING ORGANIC ELECTRONIC DEVICE ELEMENT, ORGANIC ELECTROLUMINESCENT ELEMENT, AND IMAGE DISPLAY APPARATUS

(71) Applicant: FURUKAWA ELECTRIC CO., LTD., Tokyo (JP)

(72) Inventors: Tetsuya Mieda, Tokyo (JP); Kunihiko Ishiguro, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 393 days.

(21) Appl. No.: 15/280,198

(22) Filed: Sep. 29, 2016

(65) Prior Publication Data

US 2017/0047548 A1 Feb. 16, 2017

Related U.S. Application Data

(63) Continuation of application No. PCT/JP2015/059634, filed on Mar. 27, 2015.

(30) Foreign Application Priority Data

Mar. 31, 2014 (JP) .............................. JP2014-074203

(51) Int. Cl.
*H01L 51/52* (2006.01)
*C08L 23/22* (2006.01)
(Continued)

(52) U.S. Cl.
CPC ............ *H01L 51/5253* (2013.01); *C08L 9/02* (2013.01); *C08L 9/06* (2013.01); *C08L 23/22* (2013.01);
(Continued)

(58) Field of Classification Search
CPC ...... C08L 2205/03; C08L 23/22; C08L 45/00; C08L 53/02; C08L 9/02; C08L 9/06;
(Continued)

(56) References Cited

U.S. PATENT DOCUMENTS 5,735,983 A * 4/1998 Goss ..................... B05C 5/0262
156/153
2004/0096491 A1* 5/2004 Tateishi .................. A61K 47/32
424/449
(Continued)

FOREIGN PATENT DOCUMENTS

JP  2005-129520 A  5/2005
JP  2009-524705 A  7/2009
(Continued)

OTHER PUBLICATIONS

International Search Report issued in PCT/JP2015/059634, dated Jun. 2, 2015.
(Continued)

*Primary Examiner* — Vongsavanh Sengdara
(74) *Attorney, Agent, or Firm* — Birch, Stewart, Kolasch & Birch, LLP

(57) ABSTRACT

A resin composition for sealing an organic electronic device element, containing a polyisobutylene resin (A), a hydrogenated cyclic olefin resin (B), and a polymer (C) obtained by any one of radical polymerization, anionic polymerization or coordination polymerization and exhibiting rubber elasticity, a resin sheet using the same, organic electroluminescent element, and image display apparatus.

13 Claims, 2 Drawing Sheets

(51) Int. Cl.
*C08L 53/02* (2006.01)
*C08L 45/00* (2006.01)
*C08L 9/02* (2006.01)
*C08L 9/06* (2006.01)
*C09D 109/02* (2006.01)
*C09D 109/06* (2006.01)
*C09D 123/22* (2006.01)
*H01L 51/00* (2006.01)

(52) U.S. Cl.
CPC ............... *C08L 45/00* (2013.01); *C08L 53/02* (2013.01); *C09D 109/02* (2013.01); *C09D 109/06* (2013.01); *C09D 123/22* (2013.01); *H01L 51/004* (2013.01); *H01L 51/0035* (2013.01); *C08L 2205/03* (2013.01)

(58) Field of Classification Search
CPC .. C09D 109/02; C09D 109/06; C09D 123/22; H01L 51/5253; H01L 51/0035; H01L 51/004
See application file for complete search history.

(56) References Cited

U.S. PATENT DOCUMENTS

| | | | |
|---|---|---|---|
| 2009/0026926 A1* | 1/2009 | Shirata | H01L 31/022466 313/504 |
| 2009/0026934 A1* | 1/2009 | Fujita | C09J 123/20 313/504 |
| 2009/0163685 A1* | 6/2009 | Takizawa | C08F 290/00 526/335 |
| 2009/0324940 A1 | 12/2009 | Böhm et al. | |
| 2011/0171431 A1* | 7/2011 | Ogino | G03F 7/0002 428/172 |
| 2015/0240133 A1 | 8/2015 | Nakayama et al. | |
| 2016/0017197 A1* | 1/2016 | Mieda | C08L 23/22 257/40 |
| 2016/0020426 A1 | 1/2016 | Aoyama et al. | |

FOREIGN PATENT DOCUMENTS

| | | |
|---|---|---|
| JP | 2010-500434 A | 1/2010 |
| JP | 2010-80289 A | 4/2010 |
| JP | 2010-80293 A | 4/2010 |
| JP | 2011-231313 A | 11/2011 |
| JP | 2012-193335 A | 10/2012 |
| JP | 5435520 B1 | 3/2014 |
| WO | WO 2014/069398 A1 | 5/2014 |

OTHER PUBLICATIONS

Written Opinion of the International Searching Authority issued in PCT/JP2015/059634 (PCT/ISA/237), dated Jun. 2, 2015.

* cited by examiner

RESIN COMPOSITION FOR SEALING ORGANIC ELECTRONIC DEVICE ELEMENT, RESIN SHEET FOR SEALING ORGANIC ELECTRONIC DEVICE ELEMENT, ORGANIC ELECTROLUMINESCENT ELEMENT, AND IMAGE DISPLAY APPARATUS

CROSS-REFERENCE TO RELATED APPLICATIONS

This application is a continuation of PCT/JP2015/059634 filed on Mar. 27, 2015 which claims benefit of Japanese Patent Application No. 2014-074203 filed on Mar. 31, 2014, the subject matters of which are incorporated herein by reference in their entirety.

TECHNICAL FIELD

The present invention relates to a resin composition for sealing an organic electronic device element to be used for sealing an element used in an organic electronic device (hereinafter, referred to as organic electronic device element), a resin sheet for sealing an organic electronic device element, an organic electroluminescent element, and an image display apparatus.

BACKGROUND ART

In recent years, research has been actively conducted on various organic electronic devices, such organic electroluminescent (hereinafter, also referred to as "organic EL") displays as image display apparatuses, organic EL lightings, and also an organic semiconductors, and an organic solar cells. The organic EL displays are expected as next-generation displays that would replace liquid crystal displays (LCD), and the organic EL lightings as next-generation lightings that would replace light emitting diode (LED) lightings. Further, in organic electronic device elements such as organic EL elements, all constituents can be formed of solid materials. Thus, examinations have been made on use of such elements in flexible displays or lightings.

Here, a general organic EL element has, as a basic structure, a structure in which an ITO (Indium Tin Oxide) transparent electrode (anode), an organic film (an organic positive hole transport layer, an organic light-emitting layer or the like), and a metal electrode (cathode) are formed on a substrate, and the element emit light by itself when a current is supplied between the anode layer and the cathode layer.

However, in organic electronic device elements such as organic EL elements, organic films or metal electrodes are easily deteriorated due to moisture or organic gas (hereinafter, also referred to as "outgas") emitted from constitutional members.

Therefore, in order to improve durability of the organic electronic device elements such as the organic EL elements, attempts have been made on preventing deterioration of the organic electronic device elements such as the organic EL elements, by placing the elements in an atmosphere from which moisture is eliminated, or by minimizing the outgas from the constitutional members as much as possible, or the like.

Moreover, attempts have also been made on preventing deterioration by sealing organic electronic device elements. As a material for sealing organic electronic device elements, proposed are a transparent sealing material for organic EL element as formed of a flexible polymer composition, and a removable adhesive composition containing a polyisobutylene resin and a hydrogenated petroleum resin, for example (see Patent Literature 1 and Patent Literature 2).

CITATION LIST

Patent Literatures

Patent Literature 1: JP-A-2005-129520 ("JP-A" means unexamined published Japanese patent application)
Patent Literature 2: JP-A-2012-193335

SUMMARY OF INVENTION

Technical Problem

The transparent sealing material for organic EL elements and the removable adhesive composition as described in the above-described Patent Literature 1 and 2, had high water vapor barrier properties, but they sometimes were not able to prevent an element for an organic electronic device from deterioration. Moreover, adhesion force onto an adherend was not sufficient, and durability of the organic electronic device was insufficient as caused by permeation of water through an adhesion interface. Further, the transparent sealing material for organic EL element or the removable adhesive composition described in the above-described Patent Literature 1 or 2, had a problem of poor followability to the adherend and thus allowed entry of air bubbles between the adherend and itself at the time of sealing, and thereby adversely affect appearance of the organic electronic device.

Therefore, the present invention is contemplated for providing a resin composition for sealing an organic electronic device element, having excellent water vapor barrier properties and adhesion force. Furthermore, the present invention is contemplated for providing a resin composition for sealing an organic electronic device element, having good followability to an adherend.

Moreover, the present invention is also contemplated for providing a resin composition for sealing an organic electronic device element, having a capability of improving durability of the organic electronic device element, and also providing good appearance when it is used for sealing the element.

The present invention is further contemplated for providing a resin sheet for sealing an organic electronic device element, an organic electroluminescent element and an image display apparatus, utilizing the above-described resin composition for sealing organic electronic device element, having excellent physical properties.

Solution to Problem

The present invention provides the following means.
(1) A resin composition for sealing an organic electronic device element, containing a polyisobutylene resin (A), a hydrogenated cyclic olefin resin (B), and a polymer (C) obtained by any one of radical polymerization, anionic polymerization or coordination polymerization and exhibiting rubber elasticity.
(2) A resin composition for sealing an organic electronic device element, containing a polyisobutylene resin (A), a hydrogenated cyclic olefin resin (B), and a polymer (C) obtained by any one of radical polymerization, anionic polymerization or coordination polymerization and exhibiting rubber elasticity, wherein a weight-average molecular weight (Mw) of the polyisobutylene resin (A) is 200,000 to 1,000,000, a weight-average molecular weight (Mw) of the polymer (C) is 5,000 to 1,000,000, and the polymer (C) is not a polymer synthesized by cationic polymerization.

(3) The resin composition for sealing an organic electronic device element described in item (1) or (2), wherein the polymer (C) is contained in 10 to 80% by mass in the total mass of the polyisobutylene resin (A), the hydrogenated cyclic olefin resin (B), and the polymer (C).

(4) The resin composition for sealing an organic electronic device element described in item (1) or (3), wherein a weight-average molecular weight (Mw) of the polyisobutylene resin (A) is 200,000 to 1,000,000.

(5) The resin composition for sealing an organic electronic device element described in any one of items (1) to (4), wherein the polymer (C) is a block copolymer of styrene and butadiene, a block copolymer of styrene and isoprene, or a hydrogenated product of these.

(6) The resin composition for sealing an organic electronic device element described in item (5), wherein a styrene component in the polymer (C) is contained in a proportion of 5 to 40% by mass in the total mass of the polyisobutylene resin (A), the hydrogenated cyclic olefin resin (B), and the polymer (C).

(7) The resin composition for sealing an organic electronic device element described in any one of items (1) to (6), further containing an organic-metal-based or metal-oxide-based drying agent.

(8) A resin sheet for sealing an organic electronic device element, comprising at least one sealing layer formed of the resin composition for sealing an organic electronic device element described in any one of items (1) to (7).

(9) The resin sheet for sealing an organic electronic device element described in item (8), wherein a thickness of the sealing layer is 10 to 30 μm.

(10) An organic electroluminescent element sealed with the resin composition for sealing an organic electronic device element described in any one of items (1) to (7).

(11) An organic electroluminescent element sealed with the resin sheet for sealing an organic electronic device element described in item (8) or (9).

(12) An image display apparatus, comprising the organic electroluminescent element described in item (10) or (11).

Advantageous Effects of Invention

The resin composition for sealing an organic electronic device element or the resin sheet for sealing an organic electronic device element of the present invention has high water vapor barrier properties and strong adhesion force (peeling strength). Moreover, the resin composition or the resin sheet also has excellent followability to an adherend, and can prevent entrainment of air bubbles between the adherend and itself when sealing an element.

The resin composition for sealing an organic electronic device element and the resin sheet for sealing an organic electronic device element of the present invention can improve durability of an organic electronic device element. Moreover, they can improve appearance at the time of sealing an element.

Other and further features and advantages of the invention will appear more fully from the following description, appropriately referring to the accompanying drawings.

MODE FOR CARRYING OUT THE INVENTION

Figure 1:
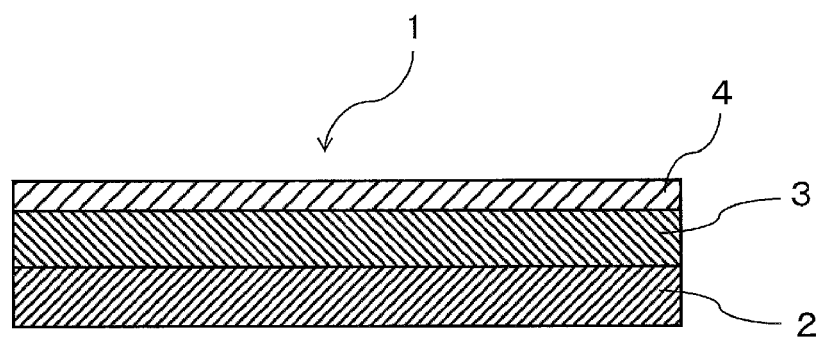
FIG. 1 is a cross-sectional view schematically showing structure of a resin sheet for sealing an organic electronic device element of a preferred embodiment of the present invention.

Modes for carrying out the present invention are described in detail below.

Note that, in the present invention, any numerical expressions in a style of " . . . to . . . " will be used to indicate a range including the lower and upper limits represented by the numerals given before and after "to", respectively.

<Resin Composition for Sealing Organic Electronic Device Element>

The resin composition for sealing an organic electronic device element of the present invention (hereinafter, also simply referred to as "sealing material" in some cases) contains a polyisobutylene resin (A), a hydrogenated cyclic olefin resin (B), and a polymer (C) obtained by any one of radical polymerization, anionic polymerization, or coordination polymerization and exhibiting rubber elasticity.

In the present invention, the resin composition can be formulated into one having excellent water vapor barrier properties and adhesion force by simultaneously using three kinds of resins: the polyisobutylene resin (A), the hydrogenated cyclic olefin resin (B) and the polymer (C) exhibiting the rubber elasticity. Moreover, the resin composition can also be formulated into one having excellent followability to a sealed material.

[Polyisobutylene Resin (A)]

As the above-described polyisobutylene resin (A) to be used in the present invention, generally a resin having a polyisobutylene skeleton as a main chain or a side chain can be used without any particular restriction. When a polyisobutylene resin is simultaneously used with the resin (B) and the copolymer (C), water vapor barrier properties and removable adhesive properties can be provided to the resin composition for sealing an organic electronic device element of the present invention. The polyisobutylene resin (A) may be a homopolymer or a copolymer. In the case of the copolymer, preferred is a copolymer of an isobutylene monomer with, as a comonomer, one or more kinds of olefins, preferably a conjugated olefin. Specific examples of the conjugated olefin preferably include 1,3-butadiene, isoprene, and 1,3-pentadiene.

The polyisobutylene resin may be synthesized by a usual method, or a commercially available one may be used.

The synthesis method is not particularly restricted, but as a specific example, a slurry method can be mentioned in which a solvent such as methyl chloride is used, and a Friedel-Crafts catalyst is used as part of a polymerization initiator.

Specific examples of the commercially available polyisobutylene resin (A) preferably usable in the present invention include Glissopal and Oppanol (B10, B12, B15, B155FN, B30SFN, B50, B80, B100, B120, B150, B220 and the like, trade names for all, manufactured by BASF), Tetrax (3T, 4T, 5T, 6T and the like, trade names for all, manufactured by JX Nippon Oil & Energy Corporation), Himol (4H, 5H, 6H and the like, trade names for all, manufactured by JX Nippon Oil & Energy Corporation), and butyl rubber (Butyl 065, Butyl 268 and Butyl 365, trade names for all, manufactured by Japan Butyl Co., Ltd.).

These items may be used alone, or in combination of two or more kinds. The combination can be selected from various viewpoints, for example, followability to an adherend, costs and viscosity.

The polyisobutylene resin (A) preferably has a weight-average molecular weight (Mw) of 200,000 to 1,000,000, and further preferably 300,000 to 500,000.

If the weight-average molecular weight is too large, the water vapor barrier properties are enhanced, but the adhesion force onto the adherend can be reduced in some cases. If the weight-average molecular weight is too small, the adhesion force is enhanced, but the water vapor barrier properties can be reduced in some cases. Even if the water vapor barrier properties are high, if adhesion force is too weak, unless further closing treatment with a glass frit or the like is applied, water vapor or impurities penetrate from a gap between the adherend and the sealing composition, and the element for the organic electronic device is easily deteriorated. On the other hand, even if the adhesion force is strong, if water vapor barrier properties are too low, though penetration of the water vapor or the like from the gap can be prevented, the water vapor permeates through a sealing layer, and therefore the element for the organic electronic device is easily deteriorated as well.

Moreover, if the weight-average molecular weight is too large, the followability to the adherend is reduced, and at the time of sealing an element, air bubbles enter between the sealing composition and the adherend, and the appearance is adversely affected in some cases.

Preferably, when the weight-average molecular weight (Mw) is 200,000 to 1,000,000, both the water vapor barrier properties and the adhesion force reach satisfactory levels, and deterioration of the element for the organic electronic device can be prevented. Moreover, the followability to the adherend is improved, no air bubbles are entrained at the time of sealing an element, and the appearance is also improved.

The weight-average molecular weight (Mw) is a polystyrene-converted weight-average molecular weight to be measured by gel permeation chromatography (GPC) using GPC System manufactured by Waters Corporation (column: "Shodex K-804" (polystyrene gel) manufactured by Showa Denko K.K., mobile phase: chloroform), for example.

The polyisobutylene resin (A) is preferably in 5 to 60% by mass, and further preferably in 10 to 55% by mass, in the total mass of the polyisobutylene resin (A), the hydrogenated cyclic olefin resin (B), and the polymer (C). When a content of the polyisobutylene resin (A) is within the above-described range, compatibility between the polyisobutylene (A) and the polymer (C) is satisfactory, and the water vapor barrier properties of the present composition can be enhanced.

[Hydrogenated Cyclic Olefin Resin (B)]

The hydrogenated cyclic olefin resin to be used in the present invention only needs to be a resin composed of a hydrogenated product of a polymer of one kind or two or more kinds of cyclic olefins, and examples include a hydrogenated petroleum resin, and specific examples include a hydrogenated material of a C5-based petroleum resin, a hydrogenated material of a C9-based petroleum resin, a copolymer resin of a C5-based petroleum resin and a C9-based petroleum resin, a hydrogenated dicyclopentadiene-based petroleum resin, a hydrogenated terpene resin, and a hydrogenated coumarone-indene resin. Above all, the hydrogenated material of the C5-based petroleum resin, the hydrogenated material of the C9-based petroleum resin or the hydrogenated material of the petroleum resin obtained by copolymerizing the C5-based petroleum resin and the C9-based petroleum resin are preferably used in view of achieving good water vapor barrier performance and transparency.

The hydrogenated cyclic olefin resin may be appropriately synthesized, or commercially available products thereof can also be used. Specific examples of the commercially available products include Clearon P, M and K series manufactured by Yasuhara Chemical Co., Ltd., Foral AX and 105 manufactured by Ashland, Inc., Alcon P and M series, Pensel A, Ester Gum H, Super Ester series and Pine Crystal series manufactured by Arakawa Chemical Industries, Ltd., IMARV (P-100, P-125, P-140) manufactured by Idemitsu Kosan Co., Ltd., Escorez (ESR, 5300, 5400 and 5600 series) manufactured by Exxon Chemical Company, and Eastotac series and Foral series manufactured by Eastman Chemical Corporation.

As the hydrogenated cyclic olefin resin (B), one having a number-average molecular weight (Mn) of 660 or more and 1,000 or less by the vapor pressure osmometry (VPO method) is preferred. When the number-average molecular weight is within the above-described range, a resin composition having excellent heat resistance and developing a function as a tackifier can be formed.

A softening point in accordance with JIS K 2207 is preferably 100° C. or higher and 150° C. or lower.

A mixing ratio (A):(B) of the polyisobutylene resin (A) to the hydrogenated cyclic olefin resin (B) is preferably 90:10 to 20:80, and particularly preferably 70:30 to 30:70, in terms of a mass ratio. When the mixing ratio of the hydrogenated cyclic olefin resin (B) is less than 10, the adhesion force is reduced or brittleness is enhanced. Therefore, bonding processability at the time of bonding a sealing layer 3 onto a glass substrate or an element substrate of an organic EL element or the like is reduced in some cases. Good bonding processability means that handling of the sealing material is easy, and even if a bonding temperature of the sealing material is low, sealing can be made with good appearance.

On the other hand, if the ratio of the polyisobutylene resin (A) is less than 20, water permeability is enhanced in some cases, a shape as a film cannot be maintained and the film is cracked in some cases.

In the total mass of the polyisobutylene resin (A), the hydrogenated cyclic olefin resin (B), and the polymer (C), a total mass of the polyisobutylene resin (A) and the hydrogenated cyclic olefin resin (B) is preferably 20 to 90% by mass, and further preferably 50 to 80% by mass.

[Polymer (C) Exhibiting Rubber Elasticity]

The polymer (C) exhibiting the rubber elasticity to be used in the present invention is a polymer having a portion that develops the rubber elasticity, for example, a soft segment. Here, the rubber elasticity means elasticity that is caused by micro-Brownian motion of individual polymer chains and in accordance with the second law of thermodynamics (principle of entropy increase). In exhibiting the rubber elasticity, it is desirable that molecules are long enough, and can freely move, and respective molecules form crosslinked points by a covalent bond or a physical bond, and are moderately connected with each other with network structure. Such a rubber elastic body exhibits properties of returning to an original shape by removing external force, up to a predetermined level of strain.

Moreover, the polymer (C) is a polymerized product by the radical polymerization, the anionic polymerization, or the coordination polymerization. In the present invention, the rubber elasticity of the polymer (C) can be effectively developed also in a resin composition by simultaneously using such a polymer (C) with the polyisobutylene resin (A) and the hydrogenated cyclic olefin resin (B). A preferred weight-average molecular weight (Mw) therefor is 5,000 to 1,000,000, and further preferably 10,000 to 500,000. If the molecular weight is outside this range, it becomes difficult to make a uniform resin composition from a compatibility problem.

That is, the polymer (C) to be used in the present invention does not include a polymer synthesized by cationic polymerization. The reason why the polymer synthesized by the cationic polymerization is unsuitable for the polymer (C) of the present invention is unclear, but it is considered to be attributable to a low degree of polymerization of the polymer synthesized by the cationic polymerization, and to an enhanced water permeability due to enhanced hydrophilicity of the resin, by an electron-donative substituent introduced in order to achieve a high degree of polymerization.

Specific examples of the polymer synthesized by the cationic polymerization include a styrene-isobutylene-styrene block copolymer (SIBS), a phenoxy resin, and the like.

The polymer (C) to be produced by the radical polymerization is not particularly restricted, and specific examples include nitrile rubber (NBR) being a copolymer of acrylonitrile and butadiene, hydrogenated nitrile rubber (HNBR), chloroprene rubber (CR) and styrene-butadiene rubber (SBR). The styrene-butadiene rubber is preferably emulsion-polymerized styrene-butadiene rubber.

Specific examples of commercially available polymer (C) to be produced by the radical polymerization and preferably used in the present invention include, as NBR, N215SL, N224SH, N230SL and N250SL (trade names for all) manufactured by JSR Corporation, Nipol (DN003, 1041, 1042, 1052J, 1043, DN401, 1312, DN601, and 1072J, trade names for all) manufactured by ZEON CORPORATION, and the like; as HNBR, Zetpol (0020, 1020, and 2020, trade names for all) manufactured by ZEON CORPORATION, and the like; as CR, Denka Chloroprene (M-30, A-30 and 90, trade names for all) manufactured by Denka Co., Ltd., and the like; and as SBR, Nipol (1052 and 1739, trade names for all) manufactured by ZEON CORPORATION and (1507 and 1723, trade names for all) manufactured by JSR Corporation, and the like.

The polymer (C) to be produced by the anionic polymerization is not particularly restricted, and specific examples include styrene-butadiene rubber (SBR), a styrene-butadiene-styrene block copolymer (SBS), a styrene-isoprene-styrene block copolymer (SIS), a styrene-ethylene-butylene-styrene block copolymer (SEBS), a styrene-ethylene-propylene-styrene block copolymer (SEPS), and the like. The styrene butadiene rubber is preferably solution-polymerized styrene-butadiene rubber.

Specific examples of the commercially available polymer (C) to be produced by the anionic polymerization and preferably used in the present invention include, as SBR, Nipol (NS116R, NS460 and NS522, trade names for all) manufactured by ZEON CORPORATION, SL (552 and 563, trade names for all, solution-polymerized styrene butadiene rubber), TR (2250, trade name, a styrene-butadiene thermoplastic elastomer) manufactured by JSR Corporation, and the like; as SBS, Tufprene A, Asaprene (T-437 and 438, trade names for all) manufactured by Asahi Kasei Chemicals Corp., and the like; as SIS, Quintac (3421, 3520, 3450, and 3433N, trade names for all) manufactured by ZEON CORPORATION, and the like; as SEBS, Tuftec (H1517, H1043, and M1943, trade names for all) manufactured by Asahi Kasei Chemicals Corp., and the like; and as SEPS, Septon 2002, 2004 and 2063 (trade names for all) manufactured by KURARAY CO., LTD, and the like.

The polymer (C) to be produced by the coordination polymerization is not particularly restricted, and specific examples include butadiene rubber (1,2-BR), isoprene rubber (trans-1,4-IR), rubber formed of a copolymer of ethylene and propylene (EPM), rubber formed of a copolymer of ethylene, propylene and diene (EPDM), and the like.

Specific examples of commercially available polymer (C) to be produced by the coordination polymerization and preferably used in the present invention include, as butadiene rubber, BR (01 and 51, trade names for all) manufactured by JSR Corporation, Nipol BR (1220 and 1250H, trade names for all) manufactured by ZEON CORPORATION, and the like; as isoprene rubber, Nipol (IR 2200 and 2200L, trade names for all) manufactured by ZEON CORPORATION, and the like; as EPM, EP (11, trade name) manufactured by JSR Corporation, and the like; and as EPDM, EP (21, 43 and 96, trade names for all) manufactured by JSR Corporation, and the like.

The polymer (C) is preferably a polymer to be produced by the anionic polymerization, and further preferably a polymer having, as a hard segment, a styrene segment composed of a styrene component.

Specific examples of a particularly preferred polymer (C) include a block copolymer of styrene and butadiene (SBS) or SEBS being a hydrogenated product thereof, and a block copolymer of styrene and isoprene (SIS) or SEPS being a hydrogenated product thereof.

Among the polymers (C), the polymer (C) containing the styrene segment contributes to development of resistance force against plastic deformation at a high temperature. The reason is unclear, but the styrene component is considered to function as a molecule-restraint component relative to a flexible component such as polyisobutylene. As a result, shearing force at a high temperature is enhanced to improve firmness in causing no slip of bonding surfaces at a high temperature. If the bonding surfaces become hard to cause slip, sealing-shape stability at a high temperature is enhanced, and optical strain on a sealed surface is minimized. Therefore, the element has excellent image display properties during use at a high temperature.

The polymer (C) further desirably contains no polar functional group. The polar functional group such as a hydroxy group, a carboxyl group and an amino group causes poor water vapor barrier properties of the resin composition for sealing and further enhances polarity of the polymer (C), and therefore causes poor compatibility to the polyisobutylene, which is a nonpolar resin.

The resin composition for sealing an organic electronic device element of the present invention contains the polymer (C) preferably in 10 to 80% by mass, and further preferably in 20 to 50% by mass, in the total mass of the polyisobutylene resin (A), the hydrogenated cyclic olefin resin (B), and the polymer (C). When a content of the polymer (C) is within the above-described range, stress relaxation is caused by elasticity of the resin, and therefore an effect of enhancement of bonding followability is obtained. Moreover, an effect of enhancement of shear adhesion force is obtained. Thus, peeling of the sealing material in a corner portion is reduced in the sealed element. As a result, deterioration of the sealed organic electronic device element can be suppressed.

By blending the polymer (C) in the above-described amount, a suitable elasticity is imparted, and a material that develops preferred bonding followability (unevenness followability) to cause no peeling can be formed. The rubber elasticity of the resin composition of the present invention is preferably 1 to 20 MPa in terms of Young's modulus.

Moreover, when the resin composition for sealing an organic electronic device element contains the polymer (C) containing the styrene segment, the styrene component in the polymer (C) is contained in a proportion of preferably 5 to 40% by mass, and further preferably 10 to 20% by mass, in the total mass of the polyisobutylene resin (A), the hydrogenated cyclic olefin resin (B), and the polymer (C). If a content of the styrene component in the polymer (C) is within the above-described range, the styrene segment functions as a hard segment of an elastic body without having a polar group that enhances water permeability, such as the hydroxy group, and therefore it is considered that, while the water vapor barrier properties are kept high, the shear adhesion force particularly at a high temperature is developed. As a result, peeling of the sealing material in the corner portion is reduced in the sealed element, and deterioration of the organic electronic device element can be suppressed.

[Drying Agent]

Moreover, the resin composition for sealing an organic electronic device element of the present invention may contain a drying agent. The drying agent is used for the purpose of capturing moisture that permeates through the resin composition. By capturing the moisture, deterioration of the element for the organic electronic device due to the moisture can be further suppressed.

The drying agent may be any of a metal oxide-based drying agent or an organic drying agent, and is not particularly restricted. Moreover, one kind or two or more kinds thereof may be blended and used.

(Metal Oxide-Based Drying Agent)

The metal oxide-based drying agent is one kind of inorganic oxide drying agents, and is ordinarily contained in the resin composition in the form of powder. A mean particle diameter thereof is ordinarily adjusted to the range of preferably less than 20 µm, further preferably 10 µm or less, and still further preferably 1 µm or less. For example, powdery metal oxide such as barium oxide (BaO), calcium oxide (CaO), strontium oxide (SrO), magnesium oxide (MgO), and zeolite (including molecular sieves) can be used. As mentioned later, when the resin composition for sealing an organic electronic device element is formed into a film, the metal oxide-based drying agent is preferably made sufficiently smaller in comparison with the film thickness. By adjusting the particle diameter in such a way, a possibility of damaging the organic EL device is reduced, and even when the composition is provided for a so-called top-emission structure device, hindrance of image recognition by drying agent particles is eliminated. In addition, if the mean particle diameter becomes less than 0.01 µm, manufacturing costs can be increased in order to prevent scattering of the drying agent particles in some cases.

(Organic Drying Agent)

An organic compound as the organic drying agent only needs to be a material that takes water therein by a chemical reaction and is not opacified before and after the reaction. An organometallic compound (also referred to as "organometallic drying agent" herein) is particularly preferred due to a drying capability thereof. The organometallic compound in the present invention is defined as a compound having a metal-carbon bond, a metal-oxygen bond, a metal-nitrogen bond or the like. Here, "metal" should include metalloid such as silicon. If water reacts with the organometallic compound, the above-mentioned bond breaks by a hydrolysis reaction and turn the organometallic compound into metal hydroxide.

Specific examples of a preferred organometallic compound in the present invention include metal alkoxide, metal carboxylate, and metal chelate. As the metal, it only need to use a metal that has high reactivity with water when it is in a form of the organometallic compound, namely a metal atom that easily causes break of the above-mentioned various bonds with metal in the presence of water. Specific examples thereof include aluminum, silicon, titanium, zirconium, bismuth, strontium, calcium, copper, sodium, lithium, magnesium, barium, vanadium, niobium, chromium, tantalum, tungsten, chromium, indium, and iron. In particular, an organometallic compound having aluminum as a central metal is preferred in view of dispersibility into the resin composition and reactivity with water.

An organic group that forms the organometallic compound together with the metal is not particularly restricted, as long as the group causes bonding with the metal through a carbon atom thereof, an oxygen atom thereof, or a nitrogen atom thereof. Specific examples of such an organic group include unsaturated hydrocarbon, saturated hydrocarbon, branched unsaturated hydrocarbon, branched saturated hydrocarbon or cyclic hydrocarbon, such as a methyl group, an ethyl group, a propyl group, a butyl group, a 2-ethylhexyl group, an octyl group, a decyl group, a hexyl group, an octadecyl group, and a stearyl group; an alkoxy group composed of any of the groups described above and an oxygen atom, an amino group composed of any of the groups described above and a nitrogen atom, or a carboxy group or a β-diketonato group (acetylacetonate group, dipivaloylmethanato group and the like). As the organometallic compound, aluminum isopropoxide is preferred.

An amount of addition of the drying agent is preferably 1 to 50 parts by mass based on 100 parts by mass in the total of the polyisobutylene resin (A), the hydrogenated cyclic olefin resin (B), and the polymer (C). If the amount of addition is less than 1 part by mass, an effect thereof is hard to be exhibited, and if the amount is 50 parts by mass or more, flowability of the resin composition for sealing an organic electronic device element is reduced, and sealing becomes difficult in some cases.

[Plasticizer]

The resin composition for sealing an organic electronic device element of the present invention may contain a plasticizer. Flowability can be varied by introducing the plasticizer thereinto. Specific examples of the plasticizer include wax, paraffin, esters such as phthalic ester and adipic ester, and low-molecular-weight polybutene and polyisobutylene.

"Polyisobutylene" as the plasticizer is different from the polyisobutylene resin (A) in the following points. That is, "polyisobutylene" enters among molecules of the resins (A), (B) and the polymer (C) and facilitates molecular motion thereof to plasticize the resin composition, and therefore "polyisobutylene" as the plasticizer needs to have sufficiently low molecular weight. Specifically, as a plasticizer, it is important to be in a liquid state at room temperature, and the "polyisobutylene" differs from the polyisobutylene resin (A) in this point. A number-average molecular weight of "polyisobutylene" as the plasticizer is preferably 300 to 3,000.

[Other Additives]

The resin composition for sealing an organic electronic device element of the present invention may contain a silane coupling agent. By use of the silane coupling agent, an amount of chemical bonding to the adherend increases, and removable adhesive characteristics are improved.

Specific examples of the silane coupling agent include 3-glycydoxypropyltrimethoxysilane, 3-glycydoxypropylmethyldimethoxysilane, 2-(3,4-epoxycyclohexyl) ethyltrimethoxysilane, N-phenyl-γ-aminopropyltrimethoxysilane, N-(2-aminoethyl) 3-aminopropylmethyldimethoxysilane, N-(2-aminoethyl) 3-aminopropylmethyltrimethoxysilane, 3-aminopropyltriethoxysilane, 3-mercaptopropyltrimethoxysilane, vinyltrimethoxysilane, N-(2-vinylbenzylamino) ethyl) 3-aminopropyltrimethoxysilane hydrochloride salt, 3-methacryloxypropyltrimethoxysilane, and the like. Two or more kinds of these silane coupling agents may be mixed. A content of the silane coupling agent is preferably 0.05 to 10 parts by mass, and further preferably 0.1 to 1 part by mass, based on 100 parts by mass in the total of the resin composition of the polyisobutylene resin (A), the hydrogenated cyclic olefin resin (B), and the polymer (C).

In the present invention, as long as the purpose of the present invention can be achieved, other components, for example, a storage stabilizer, an antioxidant, an inorganic filler, a tackiness adjuster, a resin stabilizer, and the like can be further used. When other components are used, poor visibility on an image display apparatus can be possibly caused by moisture or impurities in these components, and therefore care should be taken.

(Characteristics of Resin Composition for Sealing Organic Electronic Device Element)

Characteristics of the resin composition for sealing an organic electronic device element of the present invention are mentioned below.

(Water Vapor Transmission Rate)

In the resin composition for sealing an organic electronic device element of the present invention, permeability under 25° C./50% RH according to the test method mentioned later when a 100 μm-thick film is formed is preferably 2 g/m² day or less, and further preferably 1 g/m² day or less. Moreover, permeability under 40° C./90% RH is preferably 10 g/m²·day or less, further preferably 8 g/m²·day, and still further preferably 4 g/m²·24 h or less.

If the water vapor transmission rate is within the above-described range, infiltration of moisture into the organic electronic device element, which is caused by passage of moisture through an inside of the sealing material, can be sufficiently suppressed, and such a resin composition is preferably used for sealing an organic electronic device element.

The water vapor transmission rate can be adjusted by adjusting the weight-average molecular weight of or an amount of addition of the polyisobutylene resin (A), and further by adding the inorganic filler.

(Bonding Followability)

The resin composition for sealing an organic electronic device element of the present invention preferably does not contain air bubbles having a maximum width of 0.1 mm or more in the bonding test according to the test method mentioned below.

If the above-described air bubbles are not contained in the bonding test, the organic electronic device element that is not only satisfactory in the appearance but also uniformly sealed can be provided. Further, deterioration due to moisture permeation is uniformly and slowly developed, and therefore such a resin composition is preferably used for sealing an organic electronic device element.

(Shear Adhesion Force)

In the resin composition for sealing an organic electronic device element of the present invention, the shear adhesion force at 25° C. in a shear adhesion force test according to the method mentioned below is preferably 10 kgf (98 N) or more, and further preferably 15 kgf (147 N) or more.

Moreover, the shear adhesion force at 85° C. is preferably 0.1 kgf (0.98 N) or more, further preferably 0.2 kgf (1.96 N) or more, and still further preferably 0.5 kgf (4.9 N) or more.

If both of the shear adhesion forces are within the above-described ranges, respectively, it is not easy to destroy a sealing mechanism during ordinary use of a product, and sealing is not destroyed during a high-temperature acceleration test, either, and therefore such a resin composition is preferably used for sealing an organic electronic device element.

Moreover, the shear adhesion forces can be adjusted by addition of a resin having many polar groups, or a silane coupling agent. However, water vapor barrier properties of the sealing material can be deteriorated due to an effect of the polar group per se or by an alcohol component released from the silane coupling agent in some cases, and therefore care should be taken.

(Device Sealability)

In the resin composition for sealing an organic electronic device element of the present invention, a remaining proportion (area) of a calcium layer in a device sealability test according to the test method mentioned later (measurement of remaining proportion in the calcium test) is preferably 60% or more, and further preferably 80% or more.

If the device sealability is within the above-described range, infiltration of moisture into the device when the device is actually sealed using this resin is sufficiently small, and thus such a resin composition is preferably used for sealing an organic electronic device element.

The device sealability can be adjusted by adjusting the weight-average molecular weight of and the addition amount of the polyisobutylene resin (A), and further by adding the inorganic filler.

(Durability of Organic EL)

When the resin composition for sealing an organic electronic device element of the present invention is used in an organic EL element, durability of the organic EL element can be improved. For example, if the durability is confirmed by the test method mentioned later, the durability is preferably 200 hours or more, and further preferably 400 hours or more.

(Water Content)

In the resin composition for sealing an organic electronic device element of the present invention, the water content to be determined by the Karl Fischer method according to the moisture evaporation-coulometric titration method specified in JIS K 0068 is preferably 500 ppm or less. If the water content by the Karl Fischer method is 500 ppm or less, deterioration of the sealed element for the organic electronic device can be further retarded.

In order to adjust the water content to 500 ppm or less, moisture in the resin composition should be removed by means of a dryer such as a conical dryer and an evaporator, or a dying furnace when the resin composition is processed into a film form.

In order to prevent the resin composition for sealing an organic electronic device element from absorbing the moisture in air during storage, resulting in increased water content, the resin composition may be packed into an aluminum-laminated bag having a water vapor transmission rate of 0.1 g/(m²·d) or less in accordance with JIS Z 0222, and further well-closed in a further bag together with a drying agent such as silica gel, calcium oxide or calcium chloride, and stored therein. Moreover, the resin composition for sealing an organic electronic device element after removal of the moisture or the like may be packed into a glass bottle, a polymer bottle, a metal can, or the like, and well-closed therein, and further well-closed in an aluminum-laminated bag having a water vapor transmission rate of 0.1 g/(m²·d) or less in accordance with JIS Z 0222 together with the drying agent such as silica gel, calcium oxide, or calcium chloride, and stored therein.

(Amount of Outgas)

In the resin composition for sealing an organic electronic device element of the present invention, an amount of organic gas (hereinafter, also referred to as "outgas," excluding the moisture) emitted from constitutional members can be minimized. Specifically, the amount of emitted outgas during heating at 85° C. for 1 hour measured by the gas chromatographic analysis method specified in JIS K 0114 is preferably 500 ppm or less. If the amount of emitted outgas is adjusted to 500 ppm or less, deterioration of the sealed element for the organic electronic device can be further suppressed.

In order to adjust the amount of emitted outgas to 500 ppm or less, solvents and volatile organic molecules in the resin composition should be removed by means of a dryer such as a conical dryer and an evaporator, or a drying furnace when the resin composition is processed into a film form.

(Optical Transmittance)

The resin composition for sealing an organic electronic device element is preferably transparent in a visible region of 400 to 800 nm, and optical transmittance thereof relative to light having a wavelength of 550 nm at a thickness of 0.1 mm is preferably 85% or more. The reason is that, if the optical transmittance at 550 nm is less than 85%, the visibility is reduced. Transparency also includes, in addition to colorless transparency, colored transparency within the range in which the above-described optical transmittance is not influenced.

The optical transmittance can be adjusted by appropriately selecting the resin (A), the resin (B), or the polymer (C).

(Preparation of Resin Composition for Sealing Organic Electronic Device Element)

The resin composition for sealing an organic electronic device element of the present invention can be prepared by mixing the resin (A), the resin (B), and the polymer (C), and if desired, the additives.

In a preferred preparation method, the resin composition for sealing an element can be obtained by dissolving and mixing the resin (A), the resin (B), and the polymer (C), into an organic solvent such as toluene, to prepare a resin solution for sealing an element, and then distilling off an unwanted organic solvent by means of a dryer such as a conical dryer and an evaporator. Moreover, when the resin composition for sealing an element is processed into a film form, the resin composition for sealing an element in a film form can be obtained by coating the resin solution for sealing an element onto a PET film subjected to release treatment, and drying it in an oven at 100° C., for example.

<Resin Sheet for Sealing Organic Electronic Device Element>

The above-described resin composition for sealing an organic electronic device element can be shaped into a film or sheet, and organic electronic device elements can be assembled by using the resultant film or sheet. Moreover, the resin composition can also be directly applied onto organic electronic device elements without shaping the composition into a sheet, and used therein.

The resin sheet for sealing an organic electronic device element of the present invention is described in detail below.

The resin sheet for sealing an organic electronic device element of the present invention has a feature of having at least one sealing layer formed using the resin composition for sealing an organic electronic device element described above. The resin sheet further preferably has a base material sheet, and at least one sealing layer described above is formed on at least one side of the base material sheet.

FIG. 1 is a schematic cross-sectional view showing a preferred embodiment of a resin sheet for sealing an organic electronic device element of the present invention. As shown in FIG. 1, a resin sheet 1 for sealing an organic electronic device element has a base material sheet 2, and on the base material sheet 2, a sealing layer 3 is formed. Moreover, the resin sheet 1 for sealing an organic electronic device element further has, on the sealing layer 3, a release film 4 for protecting the sealing layer 3.

Each constituent of the resin sheet 1 of the present embodiment is described in detail below.

(Base Material Sheet 2, Release Film 4)

The base material sheet 2 is provided for temporarily attaching the resin composition thereon for the purpose of improving handling properties at the time of forming the resin composition that composes the sealing layer 3 into a film form. Moreover, the release film 4 is used for protecting the sealing layer 3.

The base material sheet 2 and the release film 4 are not particularly restricted, and specific examples thereof include a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene-vinyl acetate copolymer film, an ionomer resin film, an ethylene-(meth)acrylic acid copolymer film, an ethylene-(meth)acrylic ester copolymer film, a polystyrene film, a polycarbonate film, a polyimide film, and a fluororesin film. A crosslinked film of these films can be also used. Further, the base material sheet 2 and the release film 4 may be a stacked film of these films. Then, the base material sheet 2 and the release film 4 may be a film provided with a release layer, which is formed by applying, onto the above-mentioned film, a peeling agent including silicone or a fluorine compound. In particular, in view of the cost and the handling properties, a polyethylene terephthalate film and a film provided with the release layer thereon are preferably used.

Peeling paper prepared by coating a peeling agent on paper is not preferred as the base material sheet 2 and the release film 4. The reason is that water vapor passes through the paper to reach the sealing layer 3, and therefore the sealing layer 3 absorbs the moisture. As a result, the moisture easily migrates from the sealing layer 3 to the organic electronic device during sealing the element or the like, to accelerate deterioration of the organic electronic device. The peeling paper is not preferred, either, in view of an increased amount of emitted outgas.

An example of peeling force at the time of peeling the sealing layer 3 from the base material sheet 2 and the release film 4 is preferably 0.3 N/20 mm or less, and further preferably 0.2 N/20 mm or less. A lower limit of the peeling force is not particularly restricted, but 0.005 N/20 mm or more is practical. When peeling films are temporarily attached on both surfaces, films having different peeling force are preferably used in order to improve the handling properties.

A film thickness of the base material sheet 2 and a film thickness of the release film 4 are ordinarily 5 to 300 μm, preferably 10 to 200 μm, and particularly preferably about 20 to 100 μm.

(Sealing Layer 3)

The sealing layer 3 is formed by using the resin composition for sealing an organic electronic device element of the present invention.

At the time of coating the resin composition for sealing an organic electronic device element, the resin composition may be diluted with a solvent. Such a solvent is not particularly restricted, and specific examples thereof include organic solvents such as toluene, methyl ethyl ketone (MEK), ethyl acetate, dimethylacetamide, N-methyl-2-pyrrolidone, and a mixed solution thereof, and methyl ethyl ketone or toluene is particularly preferred. The sealing layer 3 can be obtained by adding, to such a solvent, each component to be used in the resin composition, mixing and dispersing the resultant mixture, and coating the resultant resin solution directly or by transfer, onto a peeling surface of the base material sheet 2, according to a known method such as a roll coating method, a gravure coating method, a reverse coating method, a spray coating method, an air knife coating method, a curtain coating method, a die coating method, and a comma coating method, and drying the resultant material.

The sealing layer 3 in a film form can also be obtained without using solvents. For example, the sealing layer 3 can be formed according to a method in which the resin composition for sealing an organic electronic device element is melted at a high temperature, extruded according to a generally known technique, such as a hot melt coater, and then cooled.

Even if the sealing layer 3 is formed with using the solvent as desired, as described above, the sealing layer 3, after the solvent is removed, preferably has characteristics similar to the characteristics of the resin composition for sealing an organic electronic device element of the present invention. In particular, drying of the applied resin solution, or the like may be sufficiently performed such that the water content and the amount of emitted outgas fall within the above-described ranges. Drying conditions are not particularly restricted, but when drying is performed in a drying furnace, for example, drying can be performed at a temperature of 100 to 130° C. for 5 to 30 minutes (100° C./30 minutes, 120° C./10 minutes, 130° C./5 minutes or the like).

A thickness of the sealing layer 3 is not particularly restricted, and can be appropriately selected according to an application. The thickness is ordinarily 10 to 30 μm, and preferably 15 to 25 μm. If the thickness is less than 10 μm, no sufficient adhesion strength is obtained in some cases. Moreover, if the thickness exceeds 30 μm, an area of a side surface of the sealing material exposed to air after sealing the element becomes large, and therefore an amount of water absorbed from the side surface increases, resulting in higher costs in comparison with performance.

Moreover, both of surface roughness Ra of the sealing layer 3 and surface roughness Ra of a bonding object with which the sealing layer 3 would contact are further preferably 2 μm or less. When this surface roughness exceeds 2 μm, even if the followability of the resin composition for sealing an organic electronic device element per se is high, a possibility is enhanced that the sealing layer 3 cannot fully follow the surface of the bonding object. In contrast, if the surface roughness is within a suitable range, the sealing layer 3 and the bonding object are closely adhered, and therefore the visibility is improved. The surface roughness of the bonding object can be varied by polishing or surface treatment. Moreover, the surface roughness of the sealing layer 3 can be varied by changing the surface roughness of a cooling roll at the time of forming into a film form, or changing the surface roughness of the release film 4. The surface roughness Ra is measured in accordance with the method and the conditions specified in JIS B 0601: 2001.

The resin sheet 1 for sealing an organic electronic device element may have two or more sealing layers 3, or a layer other than the sealing layer 3. Specific examples of the layer other than the sealing layer 3 include a gas barrier film, a glass plate, a metal plate or metal foil, which are to be provided on a surface of the sealing layer 3 on a side opposite to the base material sheet 2. When these layers are provided, the release film 4 needs not to be provided.

(Sealing Method)

Next, a sealing method is described in which the resin sheet 1 for sealing an organic electronic device element is used.

The resin sheet 1 for sealing an organic electronic device element of the present invention is used for sealing an element for an organic electronic device, such as an organic EL element 6. More specifically, the resin sheet 1 is preferably used for obtaining various organic electronic devices 6 having solid adhesion sealing structure, by being arranged between an element for an organic electronic device, such as an organic EL element 6, provided on an element substrate 5 (see FIGS. 2 and 3), and a sealing substrate 8 (see FIGS. 2 and 3), and air-tightly sealing the element 6 for the organic electronic device with the element substrate 5 and the sealing substrate 8. Specific examples of the organic electronic device include an organic EL display, organic EL lighting, an organic semiconductor, and an organic solar cell.

At the time of sealing the element by using the resin sheet 1 for sealing an organic electronic device element, flexibility of the resin may be adjusted by increasing or decreasing the temperature of a glass substrate or a sealing resin at the time of bonding. In this manner, the resin sheet 1 can be conformed to roughness on a surface of the substrate or a state of unevenness formed by electrode wiring or the like.

The reason why the resin sheet 1 for sealing an organic electronic device element of the present invention can seal an organic electronic device element to give an organic electronic device having high durability and preferably excellent appearance is unclear, but is considered as described below. More specifically, the resin sheet 1 for sealing an organic electronic device element of the present invention is formed of the resin composition for an organic electronic device element of the present invention, containing the resin (A), the resin (B), and the polymer (C). This resin sheet 1 can be bonded onto the organic electronic device element with strong adhesion force and preferably with high followability, and in addition thereto, the water vapor barrier properties of the resin sheet 1 per se are high.

In addition, the sealing method that uses the resin sheet 1 for sealing an organic electronic device element is described. However, in the present invention, the organic EL element 6 and the sealing substrate 8 can also be sealed by directly using the resin composition without shaping the resin composition for sealing an organic electronic device element into a sheet form. Even if the resin composition for sealing an organic electronic device element is directly used, an effect similar to the effect of the resin sheet 1 for sealing an organic electronic device element is produced.

<Organic Electroluminescent Element and Image Display Apparatus>

The organic electroluminescent element of the present invention has features in which an element is sealed with the resin composition of the present invention.

The image display apparatus of the present invention has features of having the above-described organic electroluminescent element.

The image display apparatus of the present invention has a structure in which an organic electroluminescent element is sealed with the resin composition of the present invention, and, as the structures other than the above, publicly known structure can be appropriately adopted.

As an example of the organic electronic device, an organic EL display as a preferred image display apparatus of the present invention is described below, but the present invention is not restricted thereto.

Figure 2:
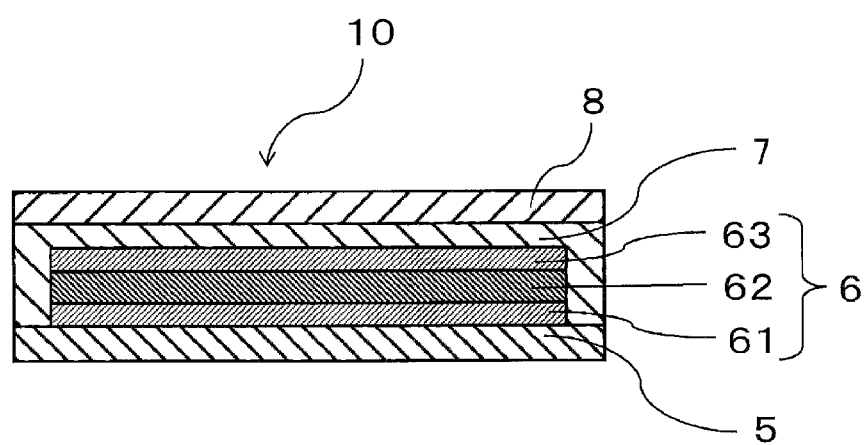
FIG. 2 is a cross-sectional view schematically showing structure of an image display apparatus in which a resin sheet for sealing an organic electronic device element of a preferred embodiment of the present invention is used.

As shown in FIG. 2, in an organic EL display 10, an organic EL element 6 provided on an element substrate 5 is sealed with a resin layer 7 for sealing an organic electronic device element (hereinafter, also referred to as a sealing resin layer) and a sealing substrate 8.

As shown in FIG. 2, for example, the organic EL device 6 has, on the element substrate 5 formed of a glass substrate or the like, an anode 61 formed by patterning an electrical conducting material thereon, an organic layer 62 that is stacked on an upper surface of the anode 61 and formed of a thin film of an organic compound material, and a cathode 63 that is stacked on an upper surface of the organic layer 62 and formed by patterning a transparent electrical conducting material thereon. In addition, part of the anode 61 and part of the cathode 63 are drawn to an end portion of the element substrate 5, and connected to a driving circuit (not shown). The organic layer 62 is formed by stacking, sequentially from a side of the anode 61, a hole injection layer, a hole transport layer, a light-emitting layer, and an electron transport layer; and the light emitting layer is formed by stacking a blue light-emitting layer, a green light-emitting layer, and a red light-emitting layer. In addition, the light-emitting layer may have a non-light-emitting intermediate layer between the blue light-emitting layer and the green light-emitting layer and between the green light-emitting layer and the red light-emitting layer for each.

In this organic EL display 10, a sealing side surface of the sealing resin layer 7 is exposed, but closing treatment with a glass frit or the like may not be applied. The reason is that the resin composition for sealing an organic electronic device element of the present invention has both high water vapor barrier properties and adhesion properties, even if the closing treatment with the glass frit or the like is not applied. Accordingly, structure can be simplified to achieve low cost.

The sealing substrate 8 only needs to be formed of a material having properties that do not significantly inhibit the visibility of a display-content on the organic EL display 10, and glass, resin or the like can be used therefor, for example. The resin composition of the present invention has high adhesion force, and when necessary, has excellent followability, and can be preferably used also when a substrate or a sealing substrate of the organic electroluminescent element has flexibility.

The sealing resin layer 7 can be formed on the sealing substrate 8 by screen printing, or using a slit die, a dispenser or the like.

Figure 3A:
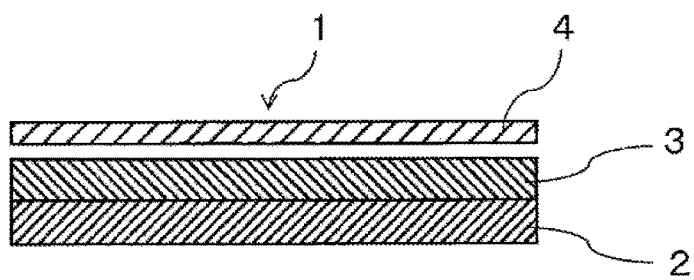
FIGS. 3(A) to 3(D) are explanatory diagrams for schematically explaining a preferred use example of a resin sheet for sealing an organic electronic device element of an embodiment of the present invention.
Figure 3B:
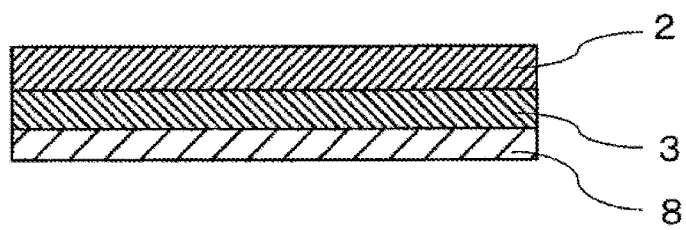
Figure 3C:
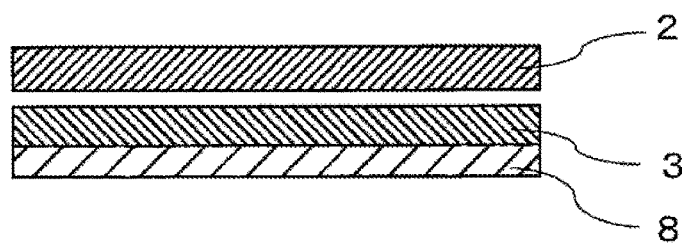
Figure 3D:
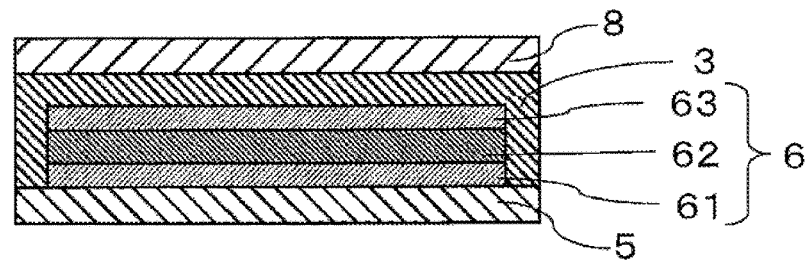

The sealing resin layer 7 is preferably formed by using the above-mentioned resin sheet 1 for sealing an organic electronic device element. In this case, the sealing resin layer 7 can be formed according to the following steps. First, as shown in FIG. 3(A), the release film 4 of the resin sheet 1 for sealing an organic electronic device element previously cut into a desired size is peeled, and as shown in FIG. 3(B), the sealing layer 3 is roll-bonded onto the sealing substrate 8. Next, as shown in FIG. 3(C), the base material sheet 2 of the resin sheet 1 for sealing an organic electronic device element as bonded onto the sealing substrate 8 is peeled. Then, as shown in FIG. 3(D), the sealing layer 3 of the resin sheet 1 for sealing an organic electronic device element as bonded onto the sealing substrate 8 is laminated onto a side of the cathode 63 of the organic EL element 6. The sealing layer 3 of the resin sheet 1 for sealing an organic electronic device element serves as the sealing resin layer 7 in the organic EL display 10.

The above-described bonding and lamination are preferably performed at a temperature of 100° C. or less. If the temperature exceeds 100° C., a constituent material of the organic EL element 6 is liable to be deteriorated and to cause reduction in light-emitting characteristics.

In addition, in the step of forming the sealing resin layer 7, the resin sheet 1 for sealing an organic electronic device element is arranged to be first roll-bonded onto the sealing substrate 8, but an organic EL element with the sealing layer 3 may be produced by bonding the sealing layer 3 onto the organic EL element 6. In this case, the sealing layer 3 is to be laminated onto the sealing substrate 8 after the base material sheet 2 of the resin sheet 1 for sealing an organic electronic device element is peeled.

Moreover, a gas barrier film may be interposed between the sealing layer 3 and the sealing substrate 8, or the resin sheet 1 for sealing an organic electronic device element in which the gas barrier film is previously bonded onto a surface of the sealing layer 3 on a side opposite to the base material sheet 2 may be used. When use is made of the resin sheet 1 for sealing an organic electronic device element in which the gas barrier film is previously bonded onto the surface of the sealing layer 3 on a side opposite to the base material sheet 2, an organic EL element with the gas barrier film and the sealing layer 3 is produced by peeling the base material sheet 2 therefrom and then bonding the sealing layer 3 onto the organic EL element 6.

The organic EL display 10 having the organic EL element 6 sealed with the sealing layer 3 has excellent appearance, and is hard to cause deterioration, and develops excellent durability.

EXAMPLES

The present invention is described in more detail based on examples given below, but the present invention is not limited by the following examples.

<Polyisobutylene Resin (FIB) (A) and the Like>

A1: Weight-average molecular weight: 75,000 (BASF, Oppanol B15SFN (registered trademark))

A2: Weight-average molecular weight: 200,000 (BASF, Oppanol B30SFN (registered trademark))

A3: Weight-average molecular weight: 750,000 (manufactured by BASF, Oppanol B80 (registered trademark))

A4: Weight-average molecular weight: 1,100,000 (BASF, Oppanol B100 (registered trademark))

<Hydrogenated Cyclic Olefin Resin (B) and the Like>

B1: Hydrogenated petroleum resin, softening point: 100° C. (manufactured by ldemitsu Kosan Co., Ltd., IMARV (registered trademark) P-100)

<Polymer (C) and the Like>
C1: NBR resin, styrene content: 0% (manufactured by ZEON CORPORATION, Nipol (registered trademark) 1072J)
C2: SEBS resin, styrene content: 43% (manufactured by Asahi Kasei Chemicals Corp., TUFTEC (registered trademark) H1517)
C3: SEBS resin, styrene content: 67% (manufactured by Asahi Kasei Chemicals Corp., TUFTEC (registered trademark) H1043)
C4: SBS resin, styrene content: 52% (manufactured by JSR Corporation, TR (trade name) 2250)
C5: SIS resin, styrene content: 16% (manufactured by ZEON CORPORATION, QUINTAC (registered trademark) 3433N)
C6: SEPS resin, styrene content: 30% (manufactured by KURARAY CO., LTD., SEPTON (registered trademark) 2004)
C7: SIBS resin, styrene content: 30% (manufactured by KANEKA CORPORATION, SIBSTAR (registered trademark) 103T)
<Resin>
C8: Phenoxy resin, styrene content: 45% (manufactured by NIPPON STEEL & SUMIKIN CHEMICAL CO., LTD., YP-50)

Example 1

A coating liquid was prepared by dissolving, into a solvent, a resin composition for sealing an organic electronic device element as composed by mixing the following components, and, by using this coating liquid, a resin sheet 1 for sealing an organic electronic device element as shown in FIG. 1 was produced.

A transparent coating liquid was obtained by dissolving, into 200 parts by mass of toluene, 57 parts by mass of polyisobutylene resin having a weight-average molecular weight of 75,000 (manufactured by BASF, Oppanol B15SFN) as a polyisobutylene resin (A), 38 parts by mass of hydrogenated petroleum resin (manufactured by Idemitsu Kosan Co., Ltd., I-MARV (registered trademark) P-100, softening point; 100° C.) as a hydrogenated cyclic olefin resin (B), and 5 parts by mass of NBR (manufactured by ZEON CORPORATION, Nipol (registered trademark) 1072J) as a polymer (C).

Next, a sealing layer 3 was formed by wholly coating, by means of an applicator, the above-described coating liquid onto a peeling-treated surface of a 38 μm-thick polyester film applied with a silicone-based peeling agent (manufactured by Mitsui Chemicals Tohcello Inc., SP-PET-03), as a base material sheet 2, so as to have a film thickness of 30 μm after being dried, and then drying the resultant material at 120° C. for 2 minutes in a drying oven. Onto the thus obtained sealing layer 3, a 38 μm-thick polyester film applied with a silicone-based peeling agent (manufactured by Mitsui Chemicals Tohcello Inc., SP-PET-01), as a release film 4, was further laminated with a peeling-treated surface thereof, to produce the resin sheet 1 for sealing an organic electronic device element of Example 1.

Examples 2 to 6, Examples 11 to 29

Resin sheets for sealing organic electronic device elements of Examples 2 to 6 and Examples 11 to 29 were produced in the same manner as in Example 1, except that coating liquids were prepared in formulations (parts by mass) shown in Table 1.

Comparative Examples 1 to 4

Resin sheets for sealing organic electronic device elements of Comparative Examples 1 to 4 were produced in the same manner as in Example 1, except that coating liquids were prepared in formulations (parts by mass) shown in Table 2.

Comparative Example 4 corresponds to Example 24 in the above-described Patent Literature 2 (JP-A-2012-193335).
(Evaluation Method)
Evaluation was performed according to the following evaluation methods. The results are shown in Tables 1 to 3.
[Measurement of Water Vapor Transmission Rate (WVTR)]
Water vapor barrier properties of the resin sheet for sealing an organic electronic device element of each of Examples and Comparative Examples were evaluated in terms of a water vapor transmission rate.

Specifically, a 100 μm-thick sample for measurement was prepared by laminating sealing-layer portions of a resin sheet for sealing an organic electronic device element, which layer had been prepared into a thickness of 20 μm in the same manner as the procedures in Example 1. Using this film, and in accordance with the dish method using calcium chloride in JIS Z 0208, mass of water vapor permeated through the film was measured after the film was allowed to stand for 24 hours under 25° C./50% RH or 40° C./90% RH. In this connection, when placing the film in a constant-temperature bath under 40° C./90% RH, the film is liable to expand due to a change in volume of air within the dish, to cause a change in a surface area or a thickness of the sample film, resulting in inaccuracy in a measured value. Therefore, the sample was reinforced with 30 μm-thick cellophane. (The permeability (literature value) of this cellophane at a thickness of 20 μm is 700 g/m$^2$·24 h under conditions of 40° C./90% RH (Journal of the Japan Society of Colour Material, Vol. 58 (1985), No. 12, pp 718-724), and this value is sufficiently large in comparison with that of each sample of Examples and Comparative Examples, and the cellophane was not obstructive to measurement.)

With regard to the water vapor transmission rate, as the value is smaller, the film is superb in the water vapor barrier properties, and in the present invention, one having 1 g/m$^2$·24 h or less in the water vapor transmission rate under 25° C./50% RH was considered as a pass. If the water vapor transmission rate under 40° C./90% RH is 4 g/m$^2$·24 h or less, the resin sheet can be preferably used even under a high-temperature and high-humidity environment.
<Measurement of Bonding Followability>
Followability of a resin sheet for sealing an organic electronic device element was evaluated depending on whether or not air bubbles were entrained into a bonded surface when the sheet was bonded with a glass substrate (bonding followability).

Specifically, the release film of the resin sheet for sealing an organic electronic device element of each of Examples and Comparative Examples was peeled, and the sealing layer side of the sheet was roll-bonded onto a 0.5 mm-thick alkali-free glass for LCD (manufactured by Nippon Electric Glass Co., Ltd., OA-10G) under conditions of 60° C. and 0.1 MPa. Then, the base material sheet was peeled, and the peeled surface was vacuum-bonded onto an A4-sized glass substrate (manufactured by Nippon Electric Glass Co., Ltd., OA-10G) under conditions of 60° C., 0.2 MPa and 2 seconds, to produce a glass-bonded sample. Appearance was visually evaluated on the glass-bonded sample obtained.

As an evaluation of the bonding followability, one not containing air bubbles having a maximum width of 0.1 mm or more is represented by "o" as a good product, one containing air bubbles having a maximum width of 0.1 mm or more is represented by "x" as a poor product. One in which air bubbles having a maximum width of 0.1 mm or more were contained immediately after vacuum bonding, but extinguished in observation after 24 hours is represented by "A." Because an inside of "air bubbles" to be produced in vacuum bonding is in vacuum, it is considered that "air bubbles" reduced their size and extinguished with elapse of time depending on flexibility of the sealing resin.

<Measurement of Shear Adhesion Force>

The release film of the resin sheet for sealing an organic electronic device element of each of Examples and Comparative Examples was peeled, and the sealing layer side of the sheet was roll-bonded onto a 0.5 mm-thick alkali-free glass for LCD (manufactured by Nippon Electric Glass Co., Ltd., OA-10G) under conditions of 80° C. and 0.1 MPa. Then, the base material sheet was peeled, a 0.5 mm-thick and 5 mm-square glass chip was placed on the sealing layer, and the resultant assembly was pressurized at a pressure of 0.1 N/m² for 10 seconds while heating at 100° C., to obtain a sample for measuring adhesion force. This sample for measurement was evaluated on shear adhesion force by using Bond Tester (manufactured by Dage Japan Co., Ltd., Universal Bond Tester 4000Plus) under conditions of a measurement temperature of 25° C. or 85° C., a shear rate of 50 μm/s, and a shear height of 75 μm.

In the present invention, one having 10 kgf (98 N) or more in the shear adhesion force at 25° C. was taken as a pass in view of "sealing stability during ordinary use."

Moreover, one having 0.1 kgf (0.98 N) or more in the shear adhesion force at 85° C. was taken as a pass in view of "sealing stability during high-temperature and constant-humidity testing."

<Measurement of Remaining Proportion in Calcium Test>

A commercial glass substrate was subjected to ultrasonic cleaning and UV ozone cleaning at 45° C. for 10 minutes. Subsequently, on this glass substrate, a metal calcium layer was formed in a 10 mm×11 mm quadrangle by means of a vacuum vapor deposition machine, to produce a calcium test specimen. Subsequently, the release film of the resin sheet for sealing an organic electronic device element prepared in each of Examples and Comparative Examples was peeled, and 17-μm-thick aluminum foil (manufactured by Mitsubishi Aluminum Co. Ltd., Mitsubishi Foil Tough) was roll-bonded onto a surface of the sealing layer under conditions of 80° C. and 0.1 MPa. Then, the base material sheet was peeled, and the surface of the sealing layer was arranged so as to cover an upper surface of the metal calcium layer and roll-bonded under conditions of 80° C. and 0.1 MPa. On the above occasion, the size of the resin sheet for sealing was a 20 mm×21 mm quadrangle, and a distance from one side of a sealed end surface to one side of the metal calcium layer was evenly adjusted to 5 mm in four directions. The test specimen obtained was stored under a high temperature and high humidity of 60° C. and 90% RH, and an area of a metal calcium portion after lapse of 100 hours was measured, to obtain a remaining proportion.

One having a remaining proportion of 60% or more was taken as a pass.

<Evaluation of Durability of Organic EL Element>

An organic EL display 10 shown in FIG. 2 was produced by using the resin sheet for sealing an organic electronic device element produced in each of Examples and Comparative Examples, and durability thereof was evaluated.

A commercial glass substrate 5 with ITO was used, subjected to etching with leaving a portion of an electrode 61, and then subjected to ultrasonic cleaning and UV ozone cleaning at 45° C. for 10 minutes. Subsequently, an organic layer 62 and a cathode 63 were formed by means of a vacuum vapor deposition machine, to produce a 19 mm-square organic EL element 6. The structure of the organic EL element was: glass substrate/ITO(300 nm)/NPB(30 nm)/Alq3 (40 nm)/Al—Li (40 nm)/Al (100 nm).

Subsequently, the release film 4 of the resin sheet 1 for sealing an organic electronic device element prepared in each of Examples and Comparative Examples was peeled, and 17 μm-thick aluminum foil (manufactured by Mitsubishi Aluminum Co. Ltd., Mitsubishi Foil Tough) was bonded onto a surface of the sealing layer 3. Then, the base material sheet 2 was peeled, the surface of the sealing layer 3 was arranged on an upper surface of the cathode 63 of the organic EL element 6, the resultant assembly was pressurized at a pressure of 0.1 MPa for 1 minute at 80° C., to produce a model of an organic EL display 10. The produced model was placed in a constant-temperature and constant-humidity bath under 60° C./90% RH, and a half-life (unit: time (h)) by which initial luminance at a current of 2 mA was reduced by half was determined up to 500 hours, by using Organic EL Luminescence Efficiency Measurement System (EL1003, manufactured by Precise Gauges Co., Ltd.).

One having 150 hours or more of the half-life was taken as a pass.

<Evaluation of Appearance>

Appearance was evaluated on the model of the organic EL display 10 produced in the same manner as the procedures in <Evaluation of durability of organic EL element> described above. Specifically, in a manner similar to the evaluation of bonding followability, one not containing air bubbles having a maximum width of 0.1 mm or more is represented by "o" as a good product, one containing air bubbles having a maximum width of 0.1 mm or more is represented by "x" as a poor product. One in which air bubbles having a maximum width of 0.1 mm or more were contained immediately after vacuum bonding, but extinguished in observation after 24 hours is represented by "Δ."

TABLE 1

|  |  |  | Comparative Example | | | | Example | | | | | |
|---|---|---|---|---|---|---|---|---|---|---|---|---|
|  |  |  | 1 | 2 | 3 | 4 | 1 | 2 | 3 | 4 | 5 | 6 |
| A1 | PIB | 75,000 | — | 60 | — | — | 57 | 9 | 54 | 12 | — | — |
| A2 | PIB | 200,000 | — | — | — | 72 | — | — | — | — | 54 | — |
| A3 | PIB | 750,000 | — | — | 30 | — | — | — | — | — | — | 54 |
| A4 | PIB | 1,100,000 | — | — | — | — | — | — | — | — | — | — |
| B1 | Hydrogenated petroleum resin | | 40 | 40 | 20 | 20 | 38 | 6 | 36 | 8 | 36 | 36 |
| C1 | NBR; styrene content: 0% | Radical polymerization | — | — | — | — | 5 | 85 | 10 | 80 | 10 | 10 |
| C2 | SEBS; styrene content: 43% | Anionic polymerization | — | — | — | — | — | — | — | — | — | — |
| C3 | SEBS; styrene content: 67% | Anionic polymerization | 60 | — | — | — | — | — | — | — | — | — |
| C4 | SBS; styrene content: 52% | Anionic polymerization | — | — | — | — | — | — | — | — | — | — |

TABLE 1-continued

|  |  |  | Comparative Example | | | | Example | | | | | |
|---|---|---|---|---|---|---|---|---|---|---|---|---|
|  |  |  | 1 | 2 | 3 | 4 | 1 | 2 | 3 | 4 | 5 | 6 |
| C5 | SIS; styrene content: 16% | Anionic polymerization | — | — | — | — | — | — | — | — | — | — |
| C6 | SEPS; styrene content: 30% | Anionic polymerization | — | — | — | — | — | — | — | — | — | — |
| C7 | SIBS; styrene content: 30% | Cationic polymerization | — | — | — | 8 | — | — | — | — | — | — |
| C8 | Phenoxy resin; styrene content: 45% | Cationic polymerization | — | — | 50 | — | — | — | — | — | — | — |
|  | Total | | 100 | 100 | 100 | 100 | 100 | 100 | 100 | 100 | 100 | 100 |
|  | Drying agent: CaO (mass parts) | | — | — | — | — | — | — | — | — | — | — |
|  | Drying agent: Aluminum isopropoxide (mass parts) | | — | — | — | — | — | — | — | — | — | — |
|  | A:B | | — | 60:40 | 60:40 | 18:5 | 57:38 | 60:40 | 60:40 | 60:40 | 60:40 | 60:40 |
|  | Styrene ratio | | 40 | 0 | 23 | 2 | 0 | 0 | 0 | 0 | 0 | 0 |
|  | WVTR: 25° C./50% RH @ 100 μm | | 0.8 | 0.6 | 2.2 | 0.7 | 0.6 | 0.8 | 0.4 | 0.7 | 0.4 | 0.4 |
|  | WVTR: 40° C./90% RH @ 100 μm | | 3.8 | 3.2 | 11.0 | 4.0 | 3.2 | 3.9 | 2.2 | 2.9 | 1.8 | 1.8 |
|  | Bonding followability: bonding at 60° C. | | x | x | No bonding was allowed due to lack in adhesion force. | x | Δ | Δ | ○ | ○ | ○ | ○ |
|  | Shear adhesion force: 25° C.; kgf/5 mm-square | | 25 | 9 | | 10 | 15 | 13 | 15 | 16 | 23 | 20 |
|  | Shear adhesion force: 85° C.; kgf/5 mm-square | | 0.1 | 0.1 | | 0.1 | 0.2 | 0.2 | 0.2 | 0.4 | 0.4 | 0.5 |
|  | Ca test remaining proportion: 60° C./90% RH/100 h | | N/A | N/A | | N/A | 63 | 60 | 72 | 68 | 84 | 85 |
|  | Organic EL element durability: 60° C./90% RH/500 h | | N/A | N/A | | N/A | 150 | 150 | 200 | 200 | 350 | 350 |
|  | Appearance | | x | x | | x | Δ | Δ | ○ | ○ | ○ | ○ |

Note 1)
Numerical values in A1 to C8 represent the content (% by mass).
Note 2)
The amount of drying agent is based on 100 parts by mass of the base resin (total of resin (A), resin (B), and polymer (C)).
Note 3)
"N/A": Not analyzed.

TABLE 2

|  |  |  | Example | | | | | | | | |
|---|---|---|---|---|---|---|---|---|---|---|---|
|  |  |  | 11 | 12 | 13 | 14 | 15 | 16 | 17 | 18 | 19 |
| A1 | PIB | 75,000 | 57 | 9 | 54 | 42 | 24 | 12 | — | — | — |
| A2 | PIB | 200,000 | — | — | — | — | — | — | — | — | — |
| A3 | PIB | 750,000 | — | — | — | — | — | — | — | — | — |
| A4 | PIB | 1,100,000 | — | — | — | — | — | — | 54 | 42 | 42 |
| B1 | Hydrogenated petroleum resin | | 38 | 6 | 36 | 28 | 16 | 8 | 36 | 28 | 28 |
| C1 | NBR; styrene content: 0% | Radical polymerization | — | — | — | — | — | — | — | — | — |
| C2 | SEBS; styrene content: 43% | Anionic polymerization | 5 | 85 | 10 | 30 | 60 | 80 | 10 | 30 | — |
| C3 | SEBS; styrene content: 67% | Anionic polymerization | — | — | — | — | — | — | — | — | 30 |
| C4 | SBS; styrene content: 52% | Anionic polymerization | — | — | — | — | — | — | — | — | — |
| C5 | SIS; styrene content: 16% | Anionic polymerization | — | — | — | — | — | — | — | — | — |
| C6 | SEPS; styrene content: 30% | Anionic polymerization | — | — | — | — | — | — | — | — | — |
| C7 | SIBS; styrene content: 30% | Cationic polymerization | — | — | — | — | — | — | — | — | — |
| C8 | Phenoxy resin; styrene content: 45% | Cationic polymerization | — | — | — | — | — | — | — | — | — |
|  | Total | | 100 | 100 | 100 | 100 | 100 | 100 | 100 | 100 | 100 |
|  | Drying agent: CaO (mass parts) | | — | — | — | — | — | — | — | — | — |
|  | Drying agent: Aluminum isopropoxide (mass parts) | | — | — | — | — | — | — | — | — | — |
|  | A:B | | 57:38 | 60:40 | 60:40 | 60:40 | 60:40 | 60:40 | 60:40 | 60:40 | 60:40 |
|  | Styrene ratio | | 2 | 37 | 4 | 13 | 26 | 34 | 4 | 13 | 20 |
|  | WVTR: 25° C./50% RH @ 100 μm | | 0.6 | 0.8 | 0.3 | 0.6 | 0.6 | 0.7 | 0.3 | 0.4 | 0.4 |
|  | WVTR: 40° C./90% RH @ 100 μm | | 3.2 | 2.5 | 2.0 | 2.0 | 2.5 | 2.5 | 1.5 | 1.9 | 1.8 |
|  | Bonding followability: bonding at 60° C. | | Δ | Δ | ○ | ○ | Δ | Δ | Δ | ○ | ○ |
|  | Shear adhesion force: 25° C.; kgf/5 mm-square | | 15 | 13 | 15 | 18 | 19 | 16 | 22 | 25 | 25 |
|  | Shear adhesion force: 85° C.; kgf/5 mm-square | | 0.5 | 0.6 | 0.4 | 0.7 | 0.8 | 0.6 | 0.7 | 1.2 | 1.2 |
|  | Ca test remaining proportion: 60° C./90% RH/100 h | | 63 | 75 | 84 | 70 | 77 | 68 | 85 | 87 | 86 |
|  | Organic EL element durability: 60° C./90% RH/500 h | | 250 | 300 | 250 | 300 | 300 | 300 | 250 | 350 | 350 |
|  | Appearance | | Δ | Δ | Δ | ○ | ○ | ○ | ○ | ○ | ○ |

Note 1)
Numerical values in A1 to C8 represent the content (% by mass).
Note 2)
The amount of drying agent is based on 100 parts by mass of the base resin (total of resin (A), resin (B), and polymer (C)).
Note 3)
"N/A": Not analyzed.

TABLE 3

|  |  |  | Example | | | | | | | | | |
|---|---|---|---|---|---|---|---|---|---|---|---|---|
|  |  |  | 20 | 21 | 22 | 23 | 24 | 25 | 26 | 27 | 28 | 29 |
| A1 | PIB | 75,000 | — | — | — | — | — | — | — | — | — | — |
| A2 | PIB | 200,000 | — | 42 | — | — | — | — | — | — | — | — |
| A3 | PIB | 750,000 | 80 | — | 42 | 42 | 42 | 42 | 24 | 42 | 42 | 42 |
| A4 | PIB | 1,100,000 | — | — | — | — | — | — | — | — | — | — |
| B1 | Hydrogenated petroleum resin | | 10 | 28 | 28 | 28 | 28 | 28 | 16 | 28 | 28 | 28 |
| C1 | NBR; styrene content: 0% | Radical polymerization | — | — | — | — | — | — | — | — | — | — |
| C2 | SEBS; styrene content: 43% | Anionic polymerization | 10 | 30 | 30 | — | — | — | — | 30 | 30 | 30 |
| C3 | SEBS; styrene content: 67% | Anionic polymerization | — | — | — | — | — | — | 60 | — | — | — |
| C4 | SBS; styrene content: 52% | Anionic polymerization | — | — | — | 30 | — | — | — | — | — | — |
| C5 | SIS; styrene content 16% | Anionic polymerization | — | — | — | — | 30 | — | — | — | — | — |
| C6 | SEPS; styrene content: 30% | Anionic polymerization | — | — | — | — | — | 30 | — | — | — | — |
| C7 | SIBS; styrene content: 30% | Cationic polymerization | — | — | — | — | — | — | — | — | — | — |
| C8 | Phenoxy resin; styrene content: 45% | Cationic polymerization | — | — | — | — | — | — | — | — | — | — |
| | Total | | 100 | 100 | 100 | 100 | 100 | 100 | 100 | 100 | 100 | 100 |
| | Drying agent: CaO (mass parts) | | — | — | — | — | — | — | — | 5 | 50 | — |
| | Drying agent: Aluminum isopropoxide (mass parts) | | — | — | — | — | — | — | — | — | — | 5 |
| | A:B | | 60:40 | 60:40 | 60:40 | 60:40 | 60:40 | 60:40 | 60:40 | 60:40 | 60:40 | 60:40 |
| | Styrene ratio | | 4 | 13 | 13 | 16 | 5 | 9 | 40 | 13 | 13 | 13 |
| | WVTR: 25° C./50% RH @ 100 μm | | 0.4 | 0.5 | 0.4 | 0.6 | 0.5 | 0.4 | 0.6 | 0.4 | 0.3 | 0.4 |
| | WVTR: 40° C./90% RH @ 100 μm | | 1.5 | 2.0 | 1.8 | 2.5 | 2.2 | 1.8 | 1.9 | 1.6 | 1.3 | 1.9 |
| | Bonding followability: bonding at 60° C. | | ◯ | ◯ | ◯ | ◯ | ◯ | ◯ | ◯ | ◯ | ◯ | ◯ |
| | Shear adhesion force: 25° C.; kgf/5 mm-square | | 20 | 23 | 20 | 22 | 25 | 23 | 23 | 35 | 50 | 20 |
| | Shear adhesion force: 85° C.; kgf/5 mm-square | | 1.5 | 1 | 1.1 | 1.3 | 1.1 | 1.1 | 1 | 1.5 | 2 | 1.1 |
| | Ca test remaining proportion: 60° C./90% RH/100 h | | 88 | 84 | 85 | 85 | 80 | 85 | 94 | 90 | 98 | 88 |
| | Organic EL element durability: 60° C./90% RH/500 h | | 400 | 450 | 450 | 450 | 450 | 450 | 450 | 500 | 500 | 500 |
| | Appearance | | ◯ | ◯ | ◯ | ◯ | ◯ | ◯ | ◯ | ◯ | ◯ | ◯ |

Note 1)
Numerical values in A1 to C8 represent the content (% by mass).
Note 2)
The amount of drying agent is based on 100 parts by mass of the base resin (total of resin (A), resin (B), and polymer (C)).
Note 3)
"N/A": Not analyzed.

As is clear from Tables 1 to 3, all Examples had excellent appearance and durability of the organic EL elements. Thus, the resin sheets for sealing an organic electronic device element contained the resin (A), the resin (B), and the polymer (C), and had excellent water vapor transmission rates (water vapor barrier properties) and adhesion force. Further, the resin sheets also had excellent followability.

All of image forming apparatus produced by using the resin sheets for sealing an organic electronic device element in Examples were found to have high durability and excellent appearance, too.

In contrast, Comparative Examples 1 to 4 in which any one of the resin (A), the resin (B), and the polymer (C) was not contained, had poor durability of the image forming apparatus. In particular, in Comparative Examples 1, 2 and 4, air bubbles were produced at the time of bonding, and poor appearance was also caused.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority on Patent Application No. 2014-074203 filed in Japan on Mar. 31, 2014, which is entirely herein incorporated by reference.

REFERENCE SIGNS LIST

1 Resin sheet for sealing organic electronic device element
2 Base material sheet
3 Sealing layer
4 Release film
5 Element substrate
6 Organic EL element
10 Organic EL display
61 Anode
62 Organic layer
63 Cathode
7 Resin layer for sealing organic electronic device element
8 Sealing substrate

The invention claimed is:

1. A resin composition for sealing an organic electronic device element, containing a polyisobutylene resin (A), a hydrogenated cyclic olefin resin (B), and a polymer (C) obtained by any one of radical polymerization, anionic polymerization or coordination polymerization, and further containing an organic-metal-based or metal-oxide-based drying agent, wherein the resin composition has a rubber elasticity of 1 to 20 MPa in terms of Young's modulus, wherein the polymer (C) comprises a styrene-ethylene-butylene-styrene block copolymer, a styrene-isoprene-styrene block copolymer, or a styrene-ethylene-propylene-styrene block copolymer, and wherein the resin composition is not curable.

2. The resin composition for sealing an organic electronic device element according to claim 1, wherein a weight-average molecular weight (Mw) of the polyisobutylene resin (A) is 200,000 to 1,000,000, a weight-average molecular weight (Mw) of the polymer (C) is 5,000 to 1,000,000, and the polymer (C) is not a polymer synthesized by cationic polymerization.

3. The resin composition for sealing an organic electronic device element according to claim 1, wherein the polymer (C) is contained in 10 to 80% by mass in the total mass of the polyisobutylene resin (A), the hydrogenated cyclic olefin resin (B), and the polymer (C).

4. The resin composition for sealing an organic electronic device element according to claim 1, wherein a weight-average molecular weight (Mw) of the polyisobutylene resin (A) is 200,000 to 1,000,000.

5. A resin sheet for sealing an organic electronic device element, comprising at least one sealing layer formed of the resin composition for sealing an organic electronic device element according to claim 1.

6. The resin sheet for sealing an organic electronic device element according to claim 5, wherein a thickness of the sealing layer is 10 to 30 μm.

7. An organic electroluminescent element sealed with the resin sheet for sealing an organic electronic device element according to claim 5.

8. An image display apparatus, comprising the organic electroluminescent element according to claim 7.

9. An organic electroluminescent element sealed with the resin composition for sealing an organic electronic device element according to claim 1.

10. An image display apparatus, comprising the organic electroluminescent element according to claim 9.

11. A resin composition for sealing an organic electronic device element, containing a polyisobutylene resin (A), a hydrogenated cyclic olefin resin (B), and a polymer (C) obtained by any one of radical polymerization, anionic polymerization or coordination polymerization, and further containing an organic-metal-based or metal-oxide-based drying agent,
wherein the resin composition has a rubber elasticity of 1 to 20 MPa in terms of Young's modulus,
wherein the polymer (C) does not contain polar functional groups, and
wherein the resin composition is not curable.

12. The resin composition for sealing an organic electronic device element according to claim 11, wherein the polymer (C) is a block copolymer of styrene and butadiene, a block copolymer of styrene and isoprene, or a hydrogenated product of these.

13. The resin composition for sealing an organic electronic device element according to claim 12, wherein a styrene component in the polymer (C) is contained in a proportion of 5 to 40% by mass in the total mass of the polyisobutylene resin (A), the hydrogenated cyclic olefin resin (B), and the polymer (C).

* * * * *